United States Patent
Lee et al.

(10) Patent No.: US 10,892,320 B2
(45) Date of Patent: Jan. 12, 2021

(54) SEMICONDUCTOR DEVICES HAVING STACKED TRENCH GATE ELECTRODES OVERLAPPING A WELL REGION

(71) Applicant: Vanguard International Semiconductor Corporation, Hsinchu (TW)

(72) Inventors: Wen-Shan Lee, Hsinchu (TW); Chung-Yeh Lee, Sinpu Township (TW); Fu-Hsin Chen, Jhudong Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/398,866

(22) Filed: Apr. 30, 2019

(65) Prior Publication Data

US 2020/0350400 A1    Nov. 5, 2020

(51) Int. Cl.

| | |
|---|---|
| H01L 29/06 | (2006.01) |
| H01L 29/423 | (2006.01) |
| H01L 29/66 | (2006.01) |
| H01L 29/78 | (2006.01) |
| H01L 29/40 | (2006.01) |
| H01L 21/033 | (2006.01) |
| H01L 21/306 | (2006.01) |
| H01L 21/265 | (2006.01) |

(52) U.S. Cl.
CPC ...... *H01L 29/0634* (2013.01); *H01L 21/0337* (2013.01); *H01L 21/26506* (2013.01); *H01L 21/306* (2013.01); *H01L 29/4236* (2013.01); *H01L 29/66477* (2013.01); *H01L 29/78* (2013.01); *H01L 29/407* (2013.01)

(58) Field of Classification Search
CPC ............ H01L 29/0634; H01L 29/4236; H01L 29/66477; H01L 29/78; H01L 29/407
See application file for complete search history.

(56) References Cited

U.S. PATENT DOCUMENTS

| | | |
|---|---|---|
| 6,600,193 B2 | 7/2003 | Darwish |
| 7,033,876 B2 | 4/2006 | Darwish et al. |
| | (Continued) | |

FOREIGN PATENT DOCUMENTS

| | | |
|---|---|---|
| TW | 200945589 A | 11/2009 |
| TW | 201222817 A | 6/2012 |
| | (Continued) | |

*Primary Examiner* — Ida M Soward
(74) *Attorney, Agent, or Firm* — Birch, Stewart, Kolasch & Birch, LLP

(57) ABSTRACT

A semiconductor device is provided. The semiconductor device includes a substrate having a first conductivity type. An epitaxial layer having the first conductivity type is disposed on the substrate, and a trench is formed in the epitaxial layer. A first well region having a second conductivity type that is different from the first conductivity type is disposed in the epitaxial layer and under the trench. A first gate electrode having the second conductivity type is disposed in the trench, and a second gate electrode is disposed in the trench on the first gate electrode, wherein the second gate electrode is separated from the first gate electrode by a first insulating layer. A method for forming the semiconductor device is also provided.

19 Claims, 15 Drawing Sheets

(56) References Cited

U.S. PATENT DOCUMENTS

| | | | | |
|---|---|---|---|---|
| 7,282,406 B2* | 10/2007 | Grivna | H01L 21/823462 | 438/247 |
| 8,198,196 B1* | 6/2012 | Murphy | H01L 29/7813 | 438/720 |
| 8,198,677 B2* | 6/2012 | Wilson | H01L 29/407 | 257/331 |
| 8,445,958 B2* | 5/2013 | Tu | H01L 29/7813 | 257/330 |
| 8,482,061 B2* | 7/2013 | Nishimura | H01L 21/26586 | 257/330 |
| 8,673,700 B2 | 3/2014 | Yedinak et al. | | |
| 9,837,528 B2* | 12/2017 | Nakazawa | H01L 27/0255 | |
| 10,325,996 B2* | 6/2019 | Schulze | H01L 29/36 | |
| 2006/0131647 A1* | 6/2006 | Meyer | H01L 29/7811 | 257/335 |
| 2006/0273386 A1* | 12/2006 | Yilmaz | H01L 29/7827 | 257/330 |
| 2008/0179670 A1* | 7/2008 | Willmeroth | H01L 29/407 | 257/340 |
| 2008/0199995 A1* | 8/2008 | Woolsey | H01L 29/4236 | 438/259 |
| 2010/0151643 A1* | 6/2010 | Hirler | H01L 29/4236 | 438/270 |
| 2010/0187602 A1* | 7/2010 | Woolsey | H01L 21/76202 | 257/330 |
| 2012/0280312 A1* | 11/2012 | Pan | H01L 29/1095 | 257/330 |
| 2013/0181284 A1* | 7/2013 | Poelzl | H01L 29/66348 | 257/332 |
| 2015/0008498 A1* | 1/2015 | Zundel | H01L 29/7804 | 257/302 |
| 2017/0062574 A1* | 3/2017 | Nagata | H01L 29/0623 | |
| 2018/0006026 A1* | 1/2018 | Lui | H01L 29/4236 | |
| 2018/0114857 A1* | 4/2018 | Okada | H01L 29/404 | |
| 2019/0273157 A1* | 9/2019 | Yilmaz | H01L 29/407 | |
| 2020/0243656 A1* | 7/2020 | Shibib | H01L 29/7827 | |

FOREIGN PATENT DOCUMENTS

| | | |
|---|---|---|
| TW | 201423995 A | 6/2014 |
| TW | 201528515 A | 7/2015 |

* cited by examiner

US 10,892,320 B2

SEMICONDUCTOR DEVICES HAVING STACKED TRENCH GATE ELECTRODES OVERLAPPING A WELL REGION

BACKGROUND

Field of the Invention

The embodiments of the invention relate to semiconductor technology, and in particular to a metal oxide semiconductor field effect transistor (MOSFET) having a trench gate and a super junction structure and methods for forming the same.

Description of the Related Art

Technology that includes high-voltage elements is implemented into integrated circuits with high voltages and high power. In order to achieve a high-withstand voltage and high current, conventional power transistors have been developed so that the flow of the driving current moves from a horizontal direction to a vertical direction. A metal oxide semiconductor field-effect transistor (MOSFET) having a trench gate and a super junction structure has been developed that is capable of increasing the doping concentration of an n-type epitaxial drift doping region, thereby improving the on-resistance (Ron) of the element.

Traditionally, multi-epi technology is used to form a super junction structure. Multi-epi technology requires multiple process cycles comprising epitaxy, p-type dopant implantation and high-temperature diffusion. Therefore, the multi-epi technology would have disadvantages such as too many steps in the process and a high cost. In addition, it is more difficult to scale down the element size of a traditional vertical diffusion MOSFET.

Therefore, it is necessary to search for a MOSFET having a trench gate and a super junction structure and methods for forming the same that can minimize or solve the problems described above.

BRIEF SUMMARY

According to some embodiments of the invention, a semiconductor device is provided. The semiconductor device includes a substrate having a first conductivity type. An epitaxial layer having the first conductivity type is disposed on the substrate, and a trench is in the epitaxial layer. A first well region is disposed in the epitaxial layer under the trench, and the first well region has a second conductivity type that is different from the first conductivity type. A first gate electrode is disposed in the trench and has the second conductivity type, and a second gate electrode is disposed in the trench on the first gate electrode, wherein the second gate electrode is separated from the first gate electrode by a first insulating layer.

According to some embodiments of the invention, a method for forming a semiconductor device is provided. The method includes providing a substrate having a first conductivity type, forming an epitaxial layer having the first conductivity type on the substrate, forming a trench in the epitaxial layer, forming a first well region in the epitaxial layer under the trench, wherein the first well region has a second conductivity type that is different from the first conductivity type. The method also includes forming a first gate electrode having the second conductivity type, and forming a second gate electrode in the trench on the first gate electrode, wherein the second gate electrode is separated from the first gate electrode by a first insulating layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
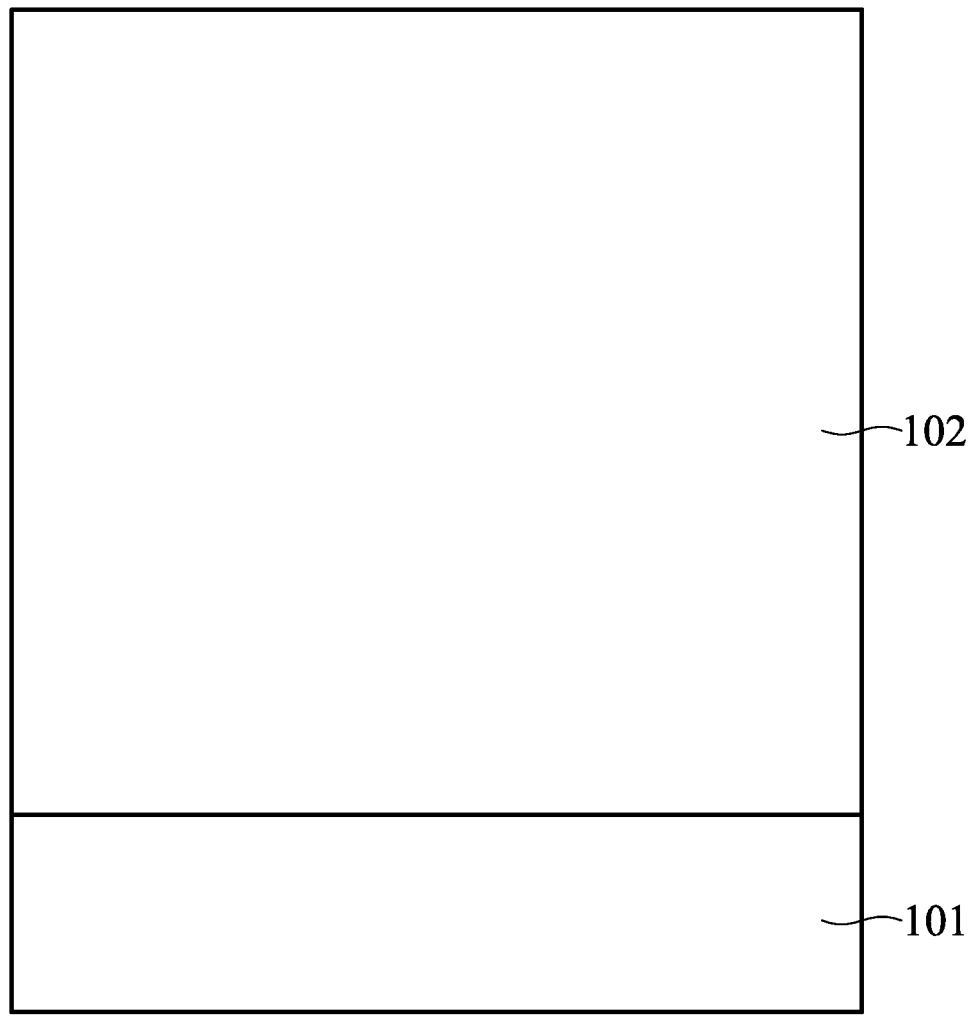
FIGS. 1A-1O show cross sections of various stages of a method for forming a semiconductor device according to some embodiments of the invention.

The following description describes semiconductor devices and methods for forming the same according to embodiments of the disclosure. However, it should be appreciated that the embodiments of the disclosure provide lots of suitable concepts of the invention and can be performed in a wide variety of specific backgrounds. The specific embodiments of the disclosure are used to explain the fabrication by specific methods and use of the invention and should not be taken in a limiting sense. The scope of the invention is best determined by reference to the appended claims. Moreover, the same or similar elements in the drawings and the description are labeled with the same reference numbers.

Figure 1B:
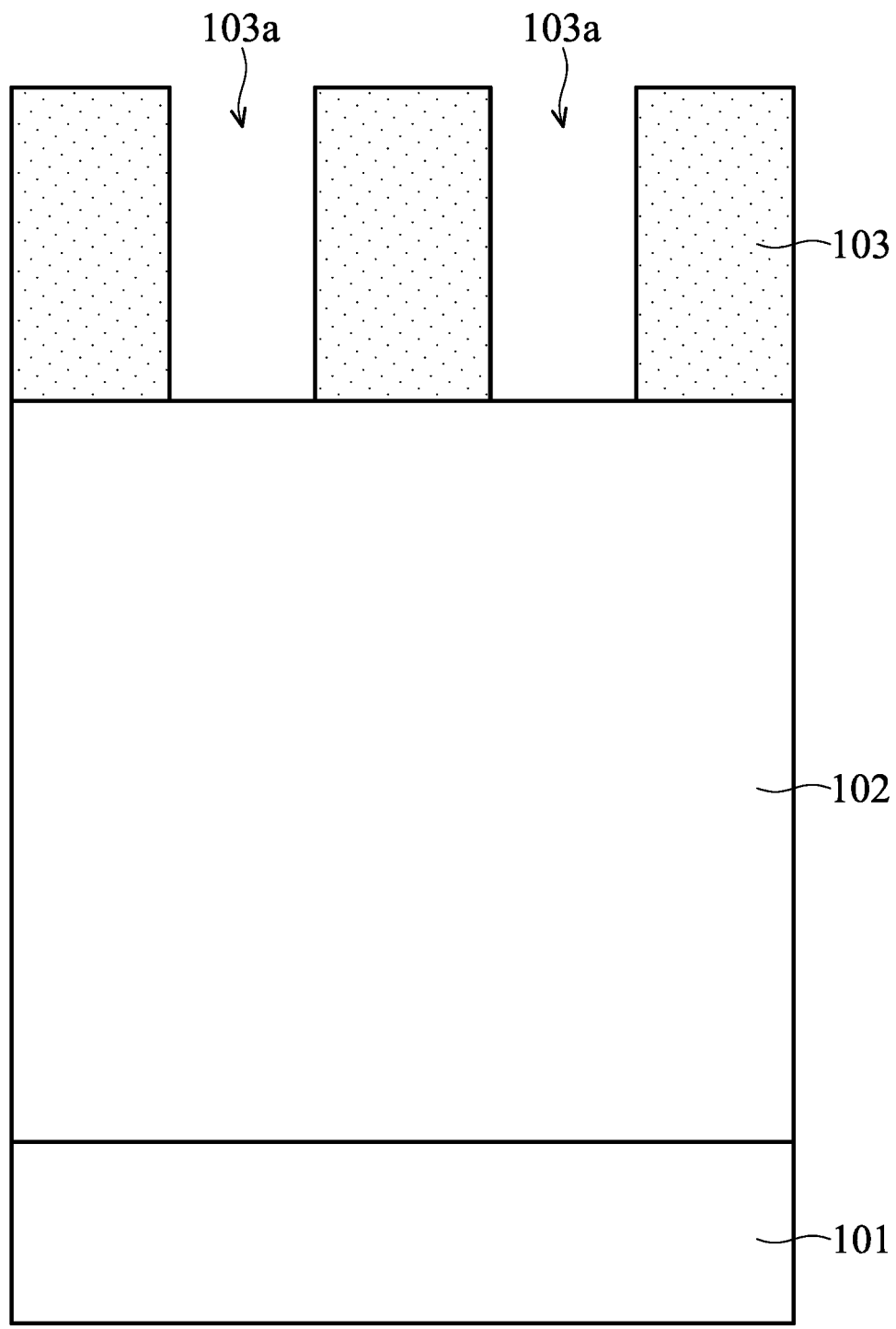
Figure 1C:
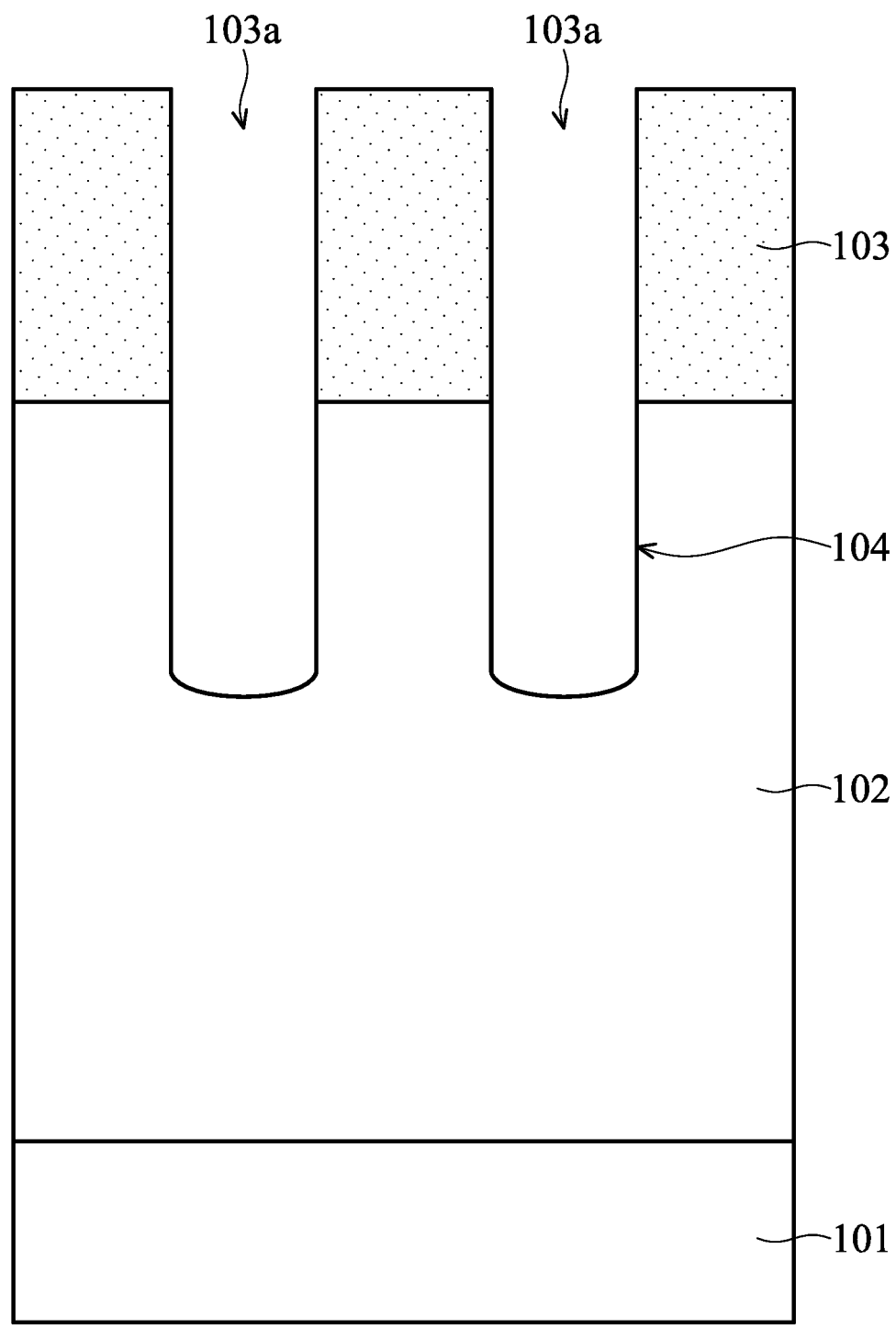
Figure 1D:
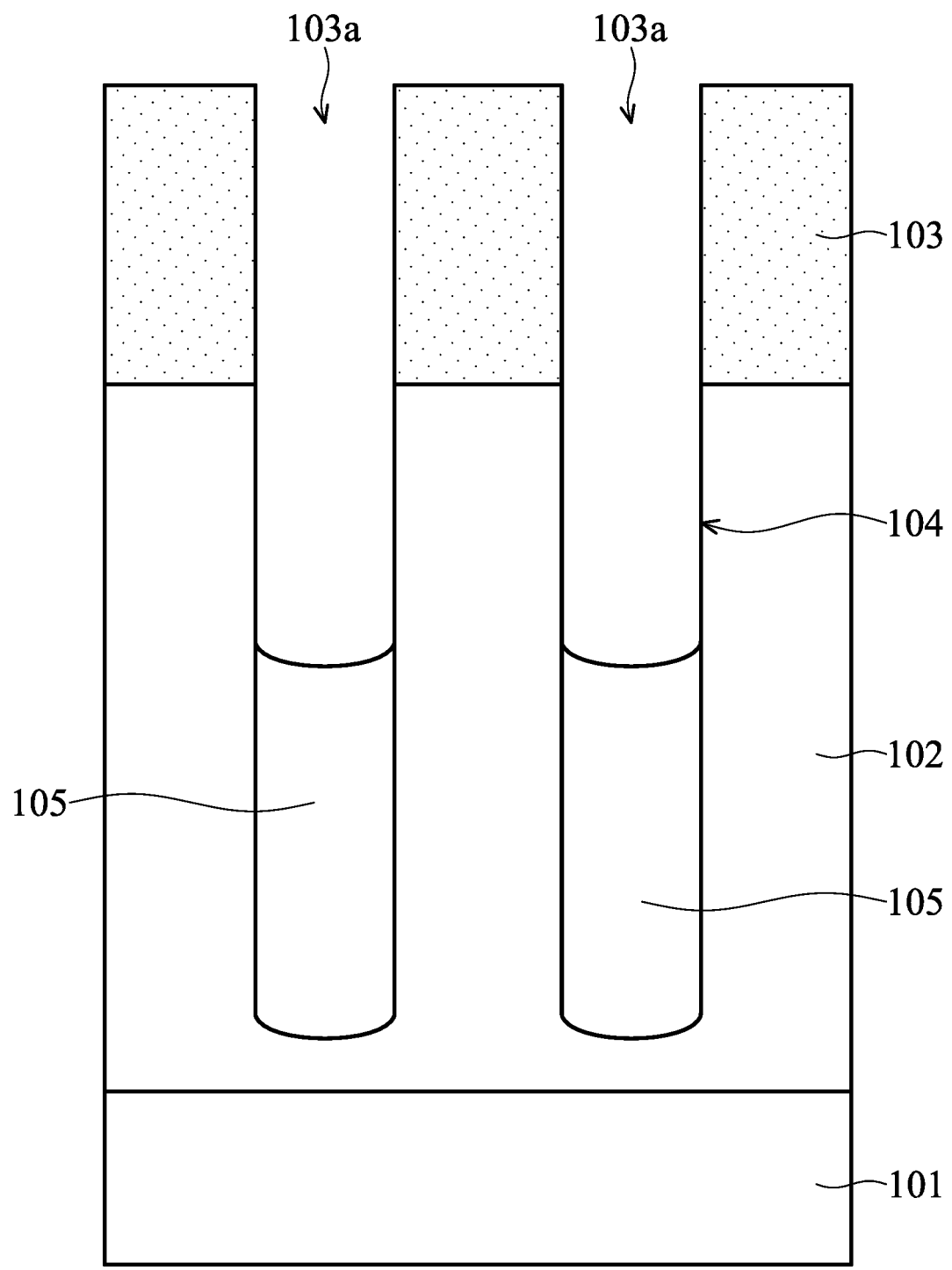
Figure 1E:
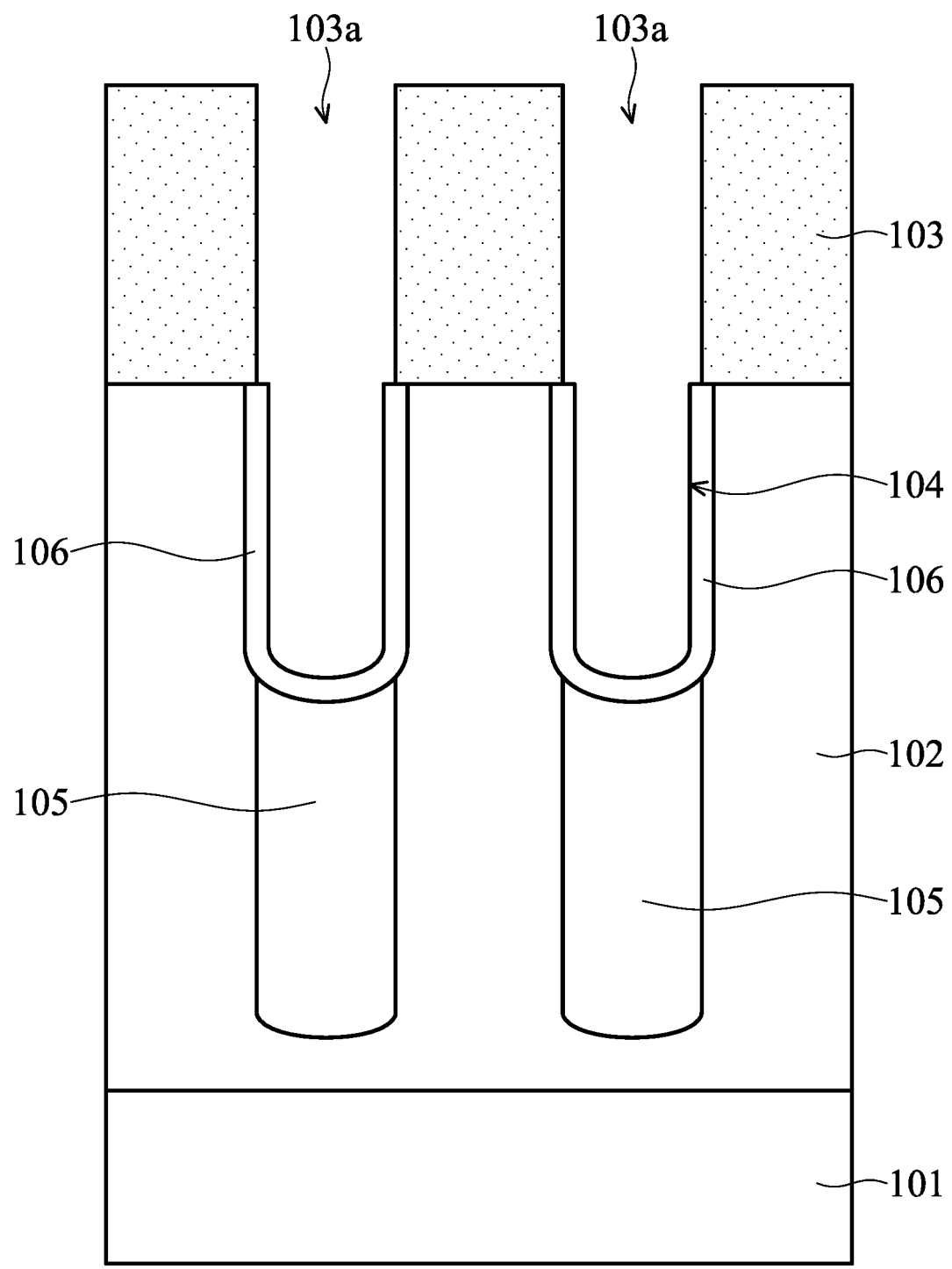
Figure 1F:
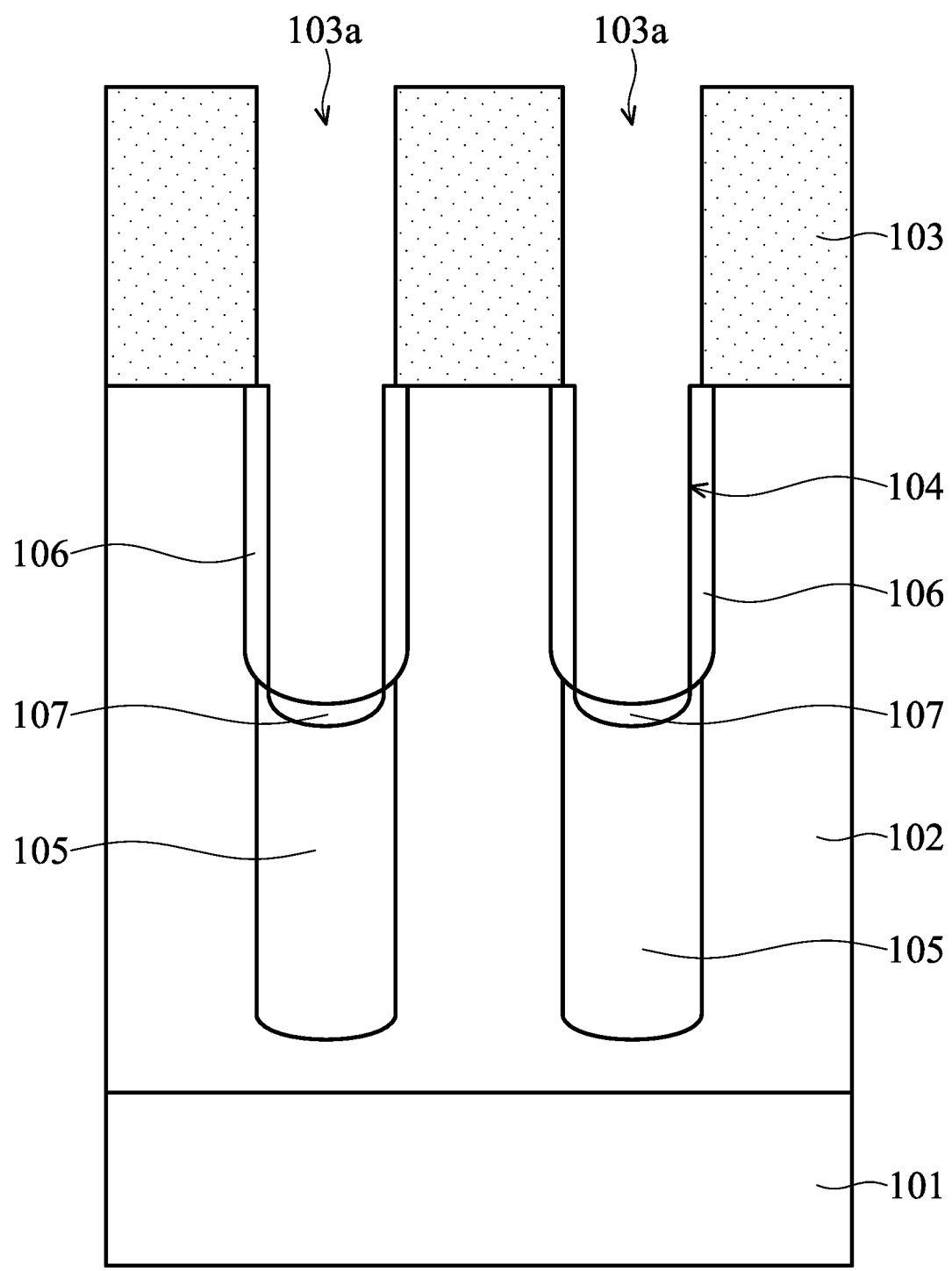
Figure 1G:
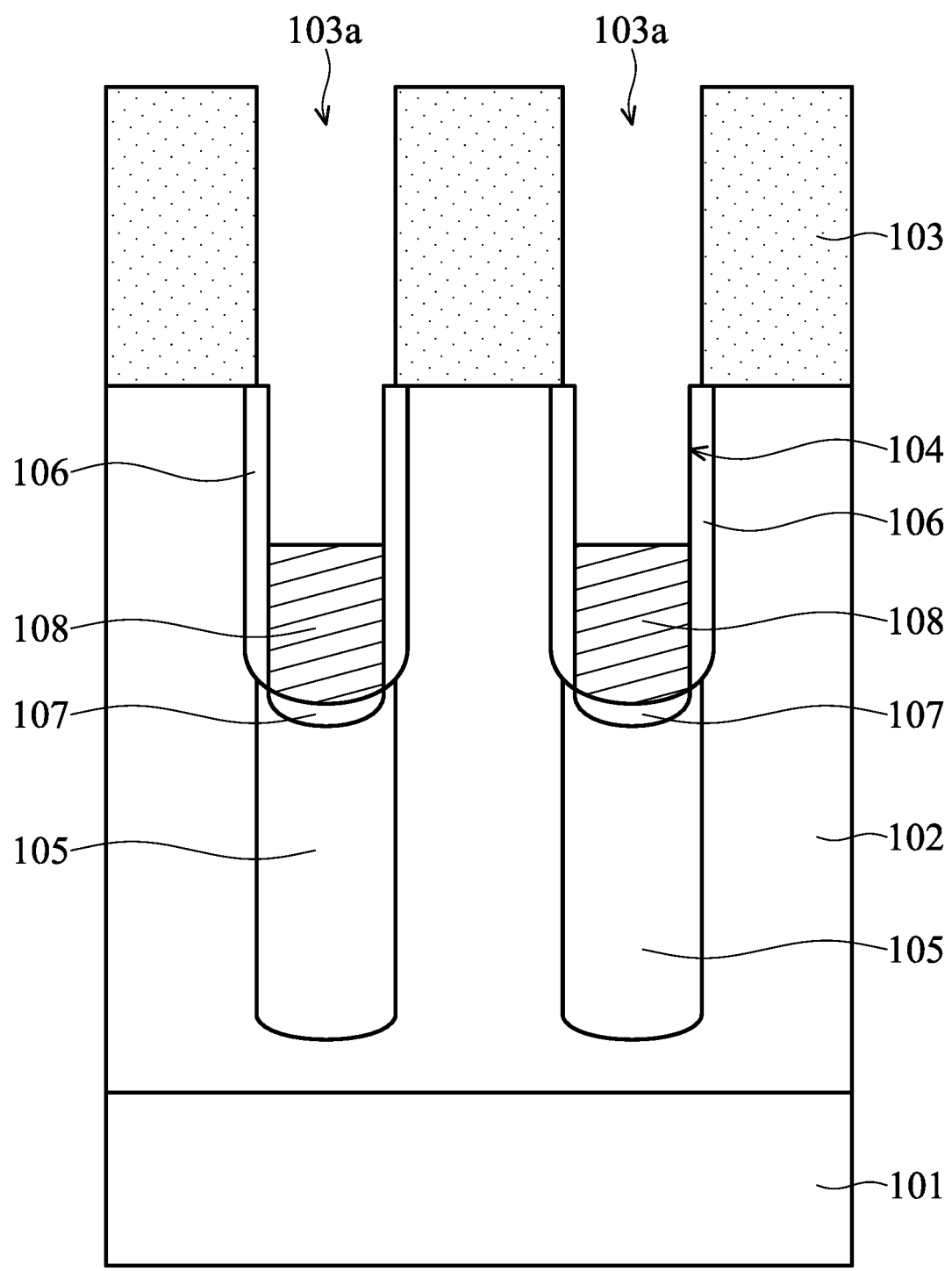
Figure 1H:
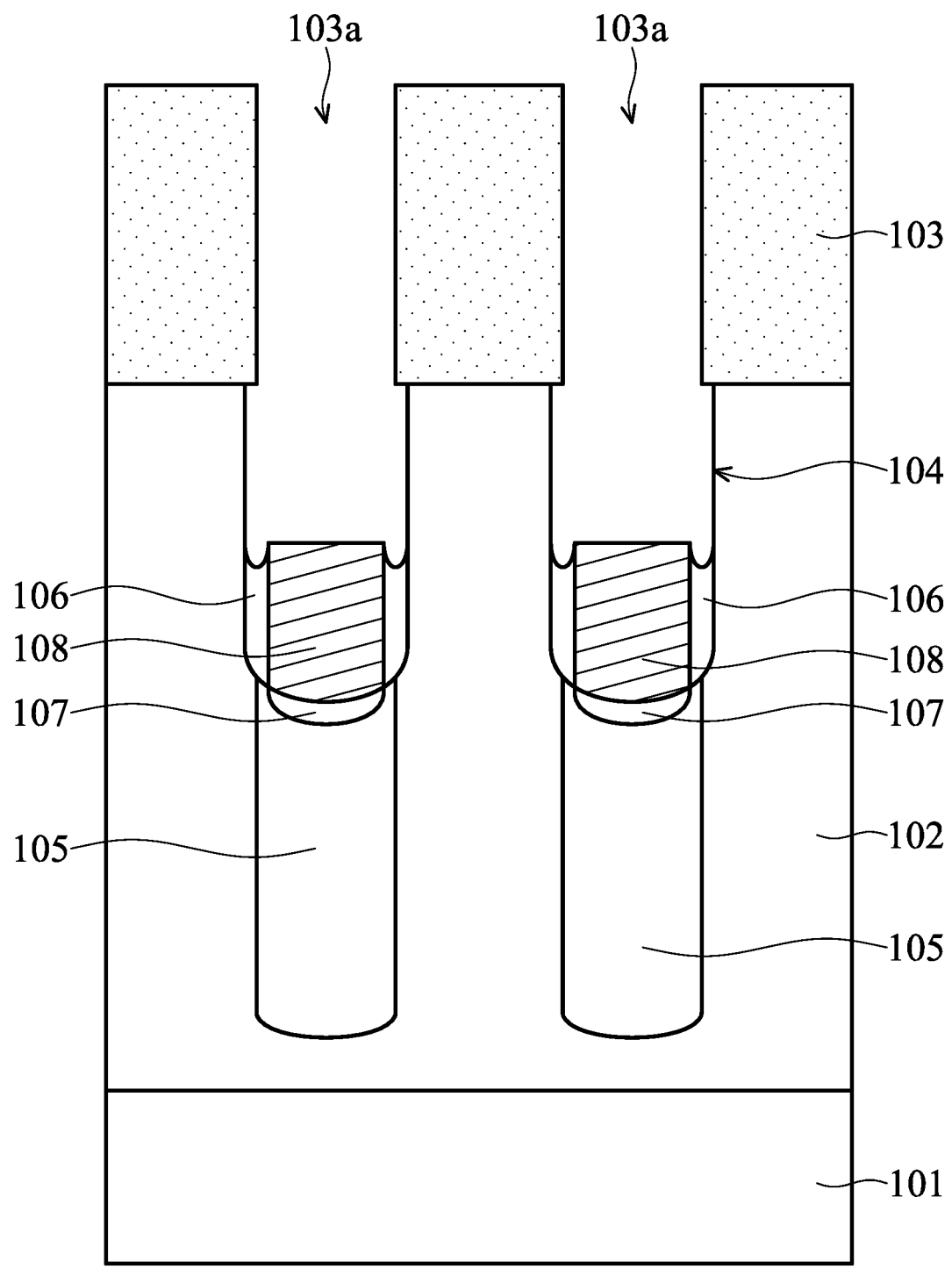
Figure 1I:
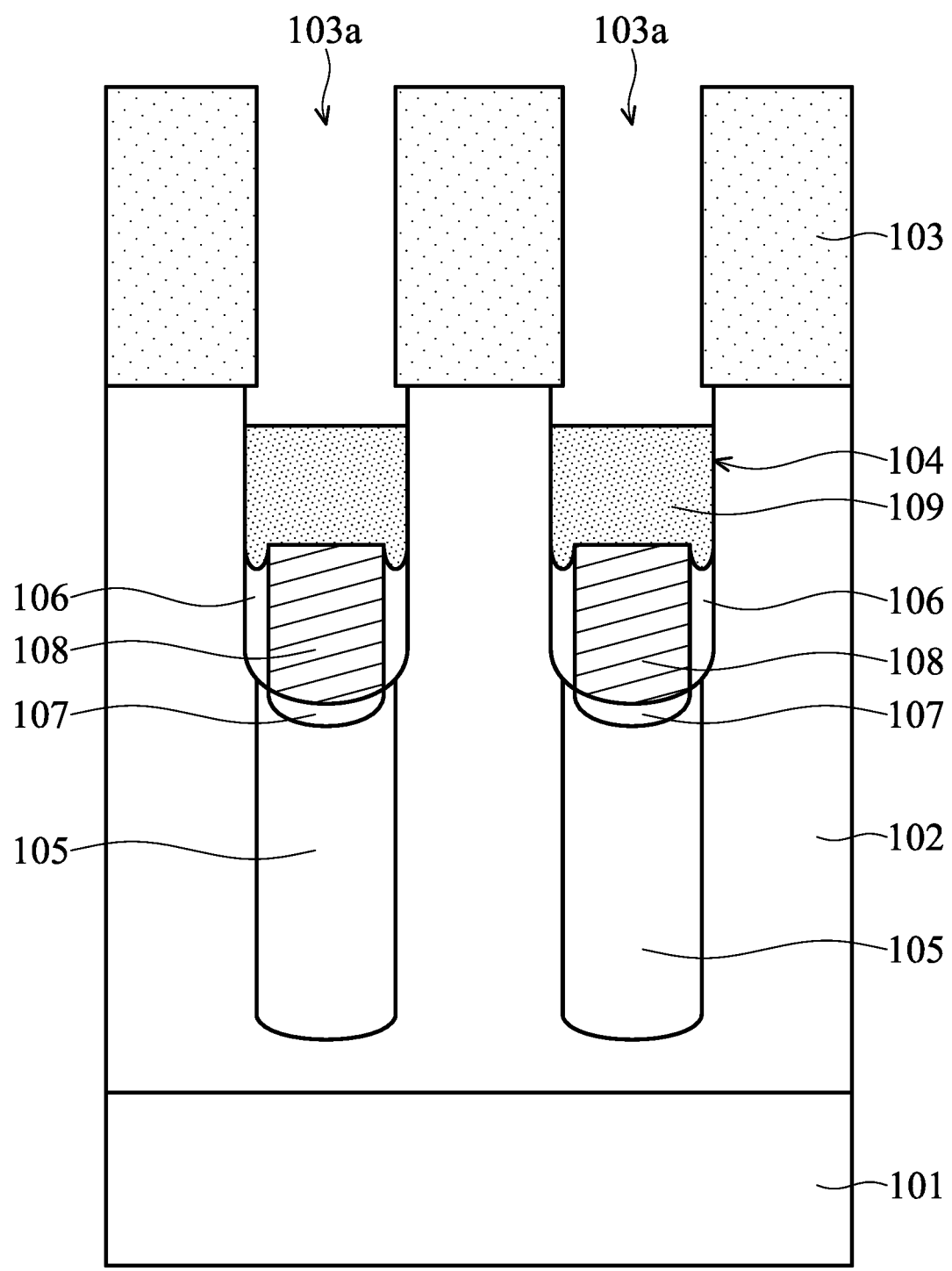
Figure 1J:
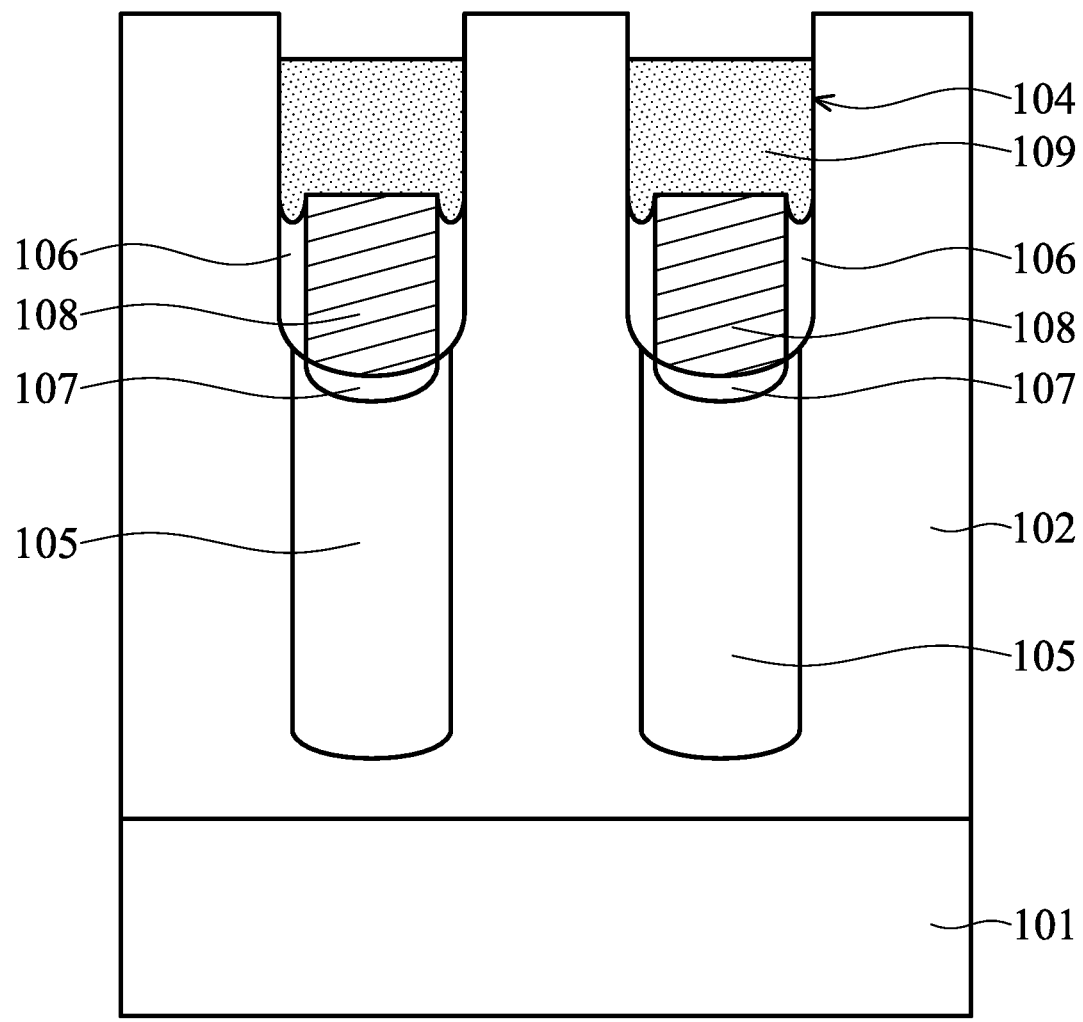
Figure 1K:
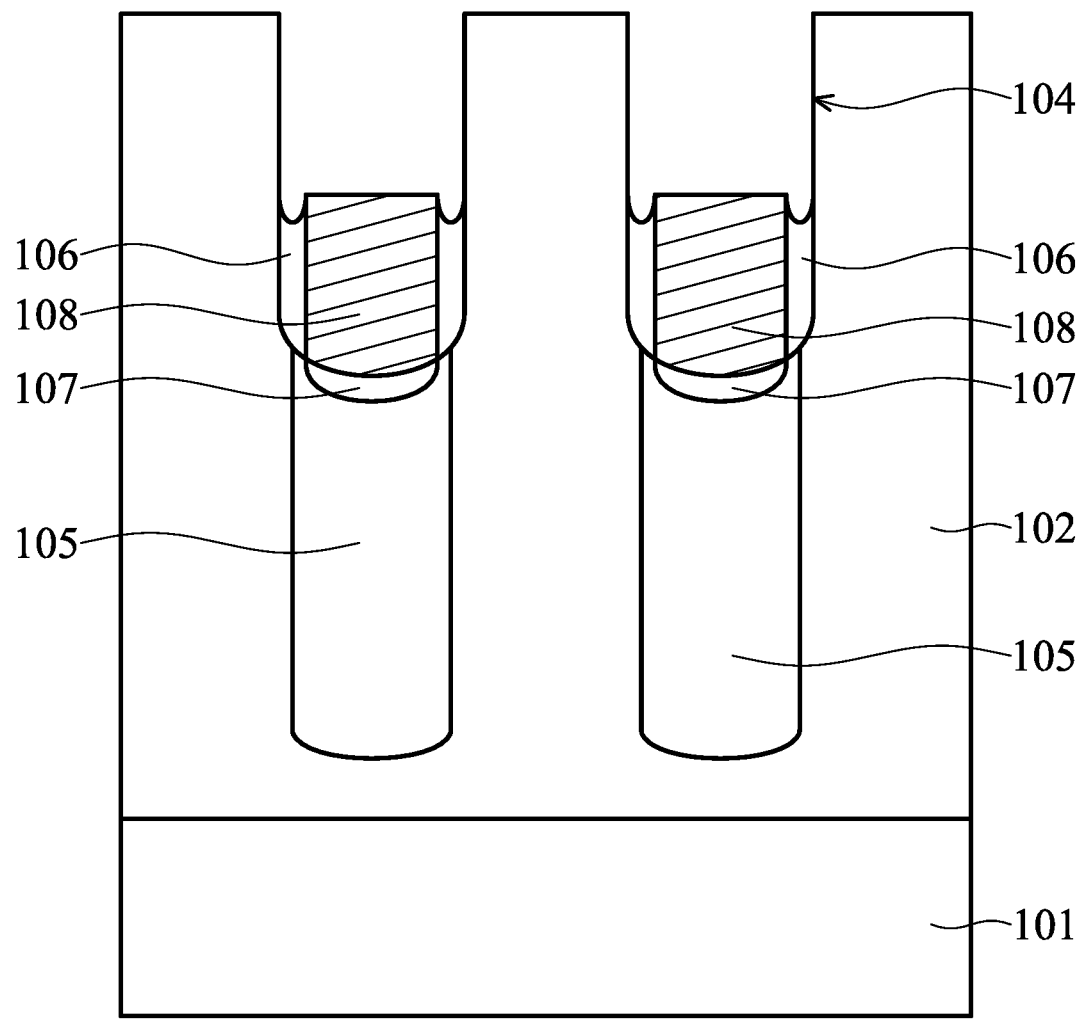
Figure 1L:
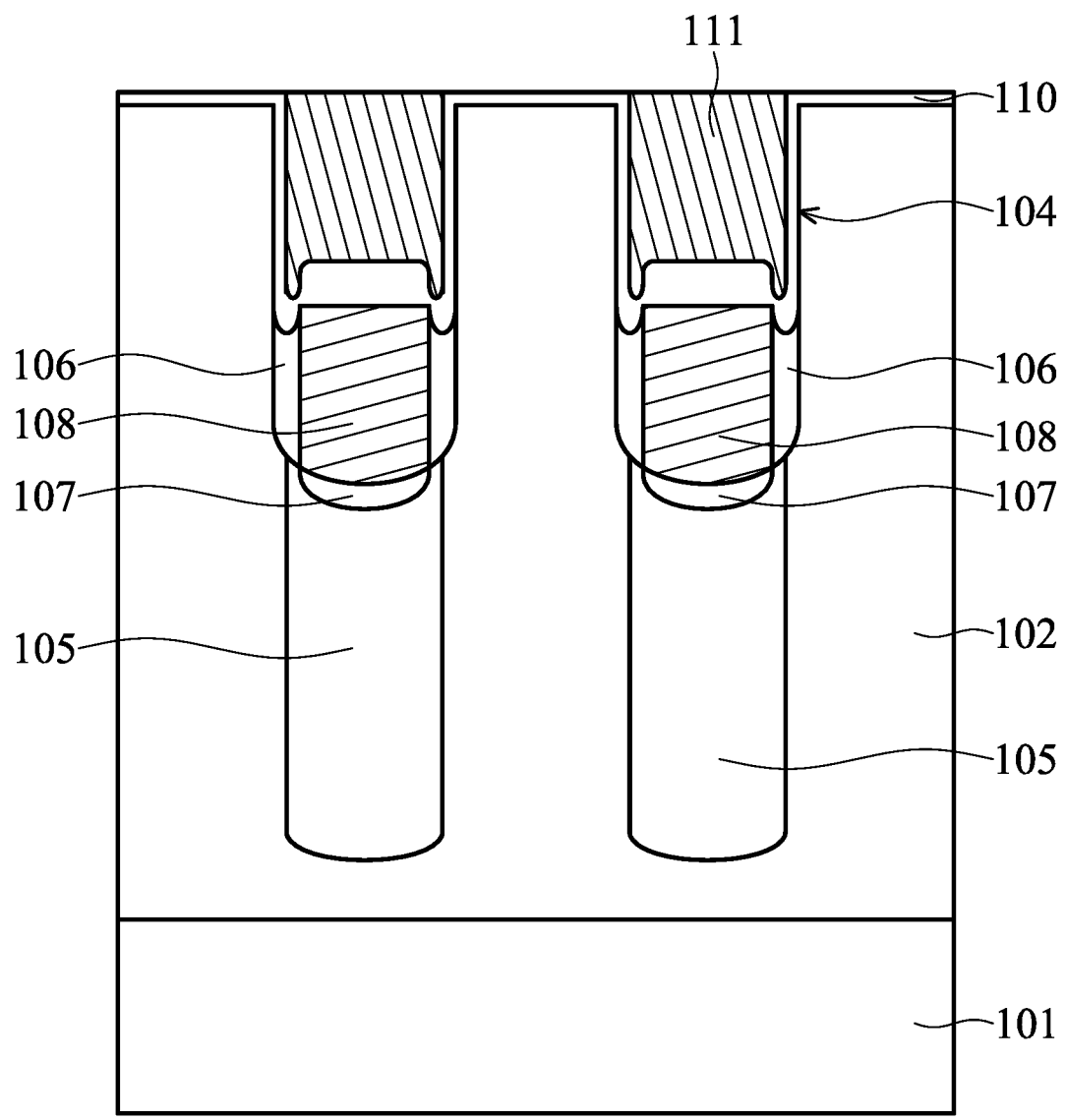
Figure 1M:
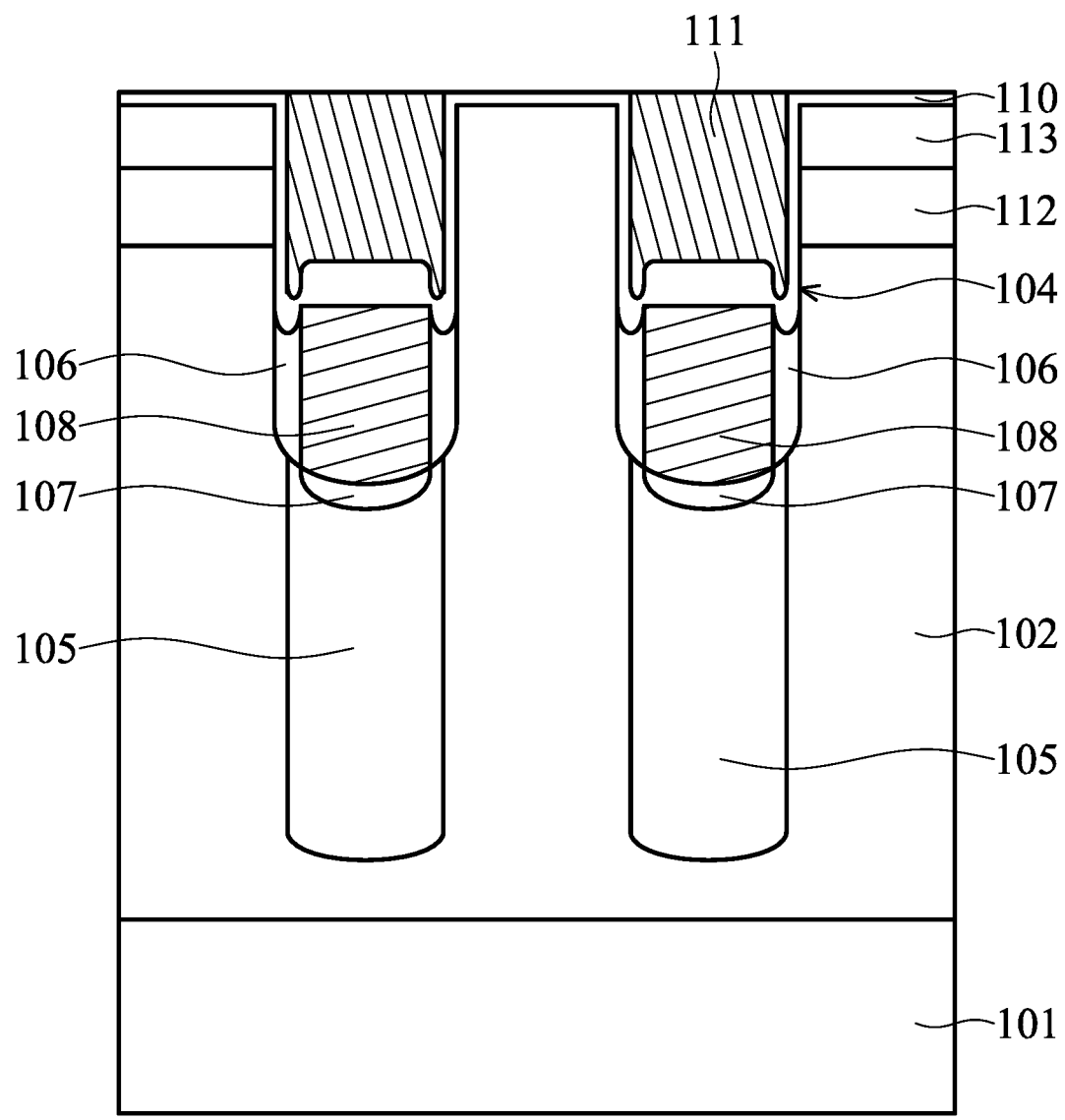
Figure 1N:
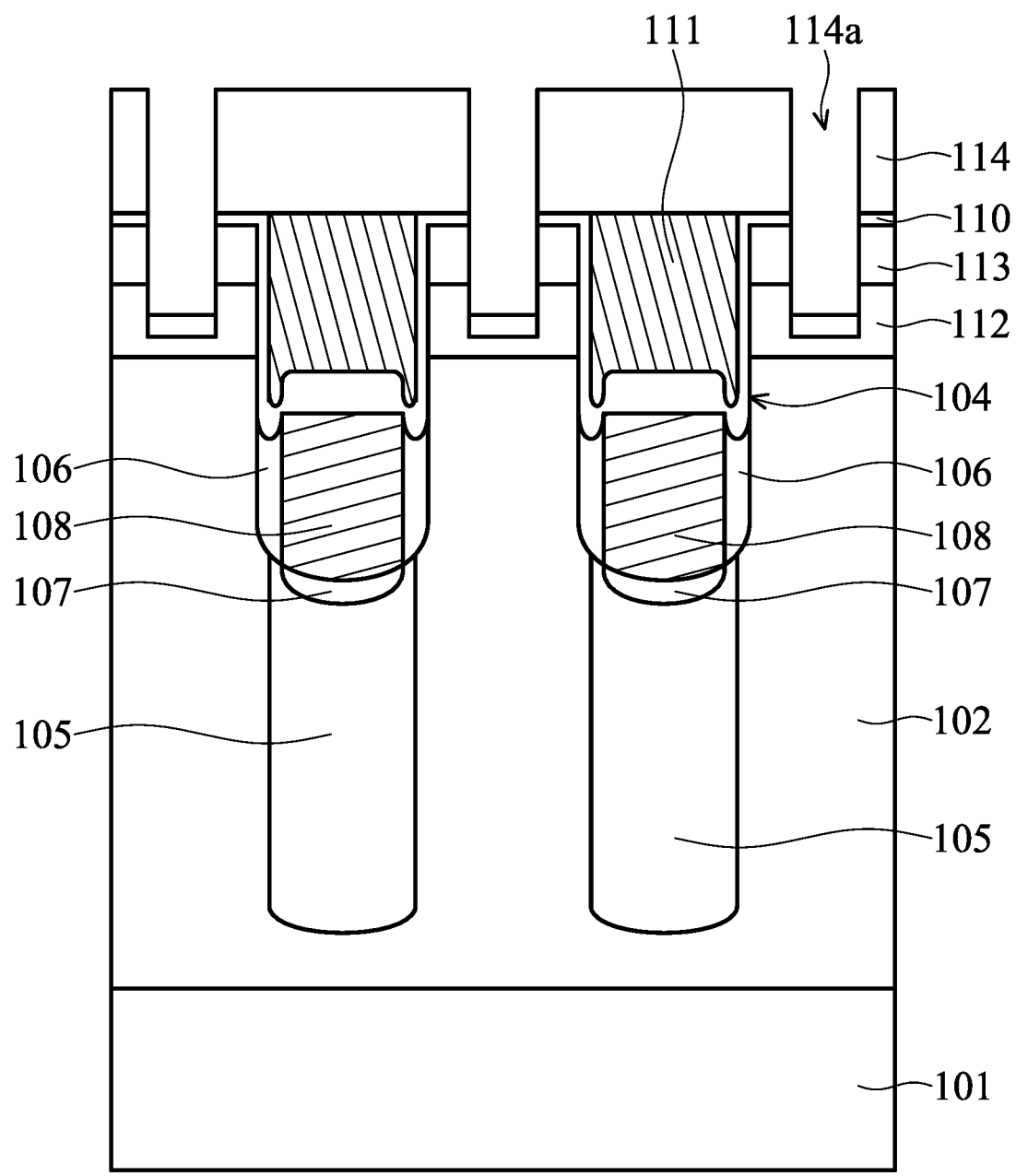
Figure 1O:
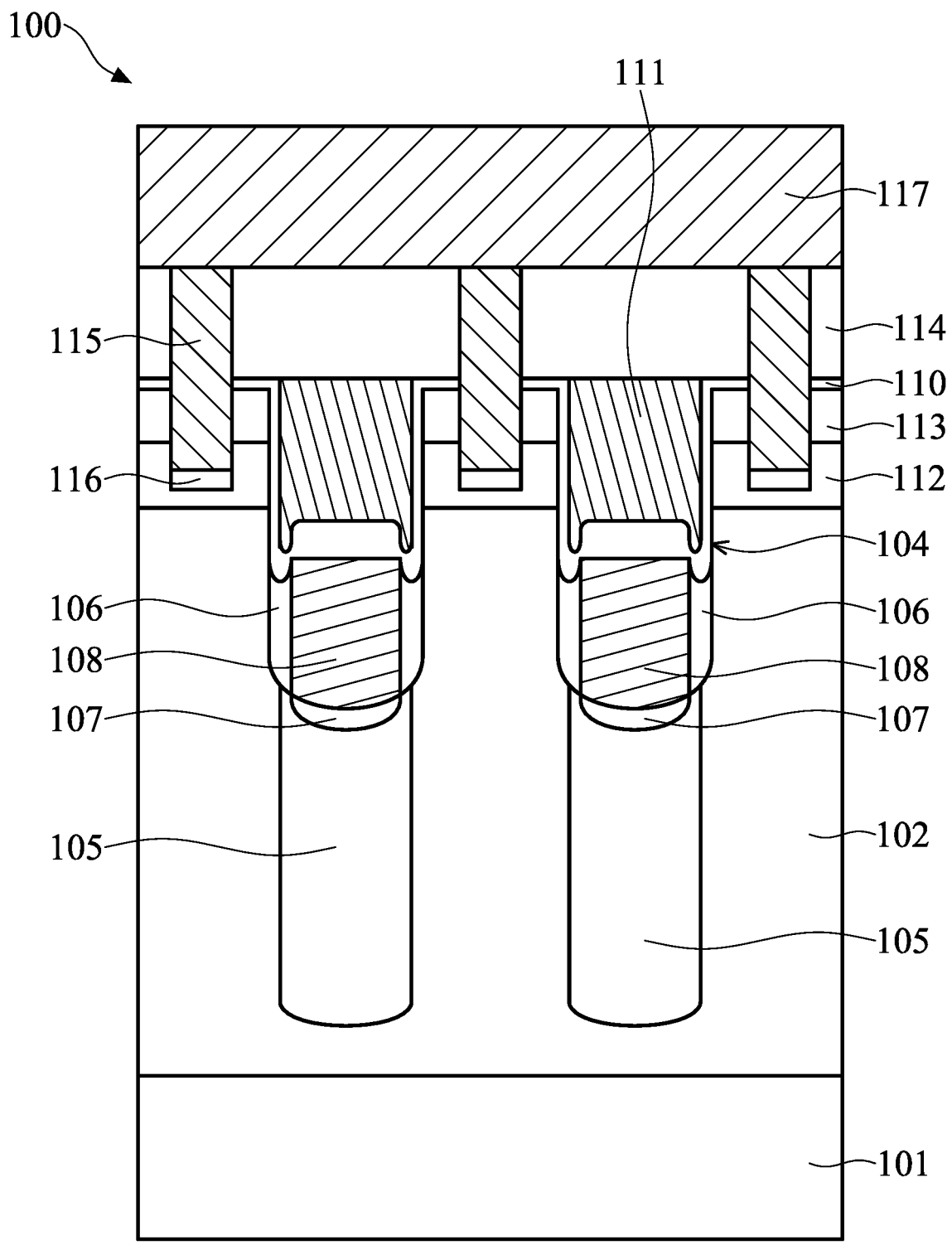

Referring to FIGS. 1A-1O, they show cross sections of various stages of a method for forming a semiconductor device 100 according to some embodiments of the invention. Additional operations can be provided before, during or after the steps of the embodiments. In different embodiments, some operations can be moved, omitted or replaced. Additional features can be added to the semiconductor device. In different embodiments, some features described below can be moved, omitted or replaced.

According to some embodiments, as shown in FIG. 1A, a substrate 101 having a first conductivity type is provided, and the substrate 101 acts as the drain (D) of the semiconductor device 100. In some embodiments, the substrate 101 is made of silicon or another semiconductor material. Alternatively, the substrate 101 can include another element semiconductor material, such as germanium (Ge). In some embodiments, the substrate 101 can be made of compound semiconductor, such as silicon carbide, gallium nitride, gallium arsenide, indium arsenide or indium phosphide. In some embodiments, the substrate 101 can be made of alloy semiconductor, such as silicon germanium, silicon germanium carbide, arsenic gallium phosphide or indium gallium phosphide. In some embodiments, the substrate 101 includes silicon-on-insulator (SOI) substrate or another suitable substrate. In the embodiment, the first conductivity type is n-type, but it is not limited thereto. In other embodiments, the first conductivity type can be p-type.

Next, according to some embodiments, an epitaxial growth process is performed. An epitaxial layer 102 is formed on the substrate 101. The substrate 101 and the epitaxial layer 102 have the same conductivity type, such as the first conductivity type. In the embodiment, the epitaxial layer 102 is n-type. In some embodiments, the epitaxial growth process can be metal organic chemical vapor deposition (MOCVD), plasma-enhanced CVD (PECVD), molecular beam epitaxy (MBE), hydride vapor phase epitaxy (HVPE), liquid phase epitaxy (LPE), chloride vapor phase epitaxy (Cl-VPE), another suitable process or a combination thereof.

Next, according to some embodiments, as shown in FIG. 1B, a patterned mask 103 is formed on the epitaxial layer 102 through a lithography patterning process. The patterned mask 103 has an opening 103a. In the embodiment, the material of the patterned mask 103 can be photoresist material. In other embodiments, the material of the patterned mask 103 can be a hard mask made of an oxide layer and a nitride layer. In some embodiments, the lithography patterning process includes photoresist coating (for example, spin-coating), soft baking, mask aligning, exposing, post-exposure baking, photoresist developing, washing and drying (for example, hard baking), another suitable process, or a combination thereof.

According to some embodiments, as shown in FIG. 1C, after forming the patterned mask 103, an etching process is performed on the epitaxial layer 102 through the first opening 103a of the patterned mask 103 to form a trench 104 in the epitaxial layer 102. In some embodiments, the etching process may be a dry etch process, a wet etch process, a plasma etching process, a reactive ion etching process, another suitable process, or a combination thereof. It should be understood that the size, shape and location of the trench 104 shown in FIG. 1C is only an example of the embodiments, but it is not limited thereto.

Then, according to some embodiments, performing an ion implantation process and a drive in process to the trench 104 to form a first well region 105 by using the patterned mask 103 as a protective mask. In the embodiment, the first well region 105 is disposed under the trench 104, and the first well region 105 is vertically overlapped with the trench 104. In the embodiment, the first well region 105 has a different conductivity type than the substrate 101 and the epitaxial layer 102. For example, the first well region 105 has a second conductivity type. In other words, in the embodiment, the first well region 105 is p-type. In some embodiments, the dopant of the first well region 105 may be boron (B). In some embodiments, the doping concentration of the first well region 105 is in a range from about 1E15 atoms/cm$^3$ to about 1E18 atoms/cm$^3$.

In the embodiment, since the first well region 105 is disposed under the bottom of the trench 104 by the ion implantation process and the drive in process, requirements for multiple process cycles comprising epitaxy, p-type dopant implantation and high-temperature diffusion can be omitted. Therefore, the process of forming the first well region 105 is simple, and the expensive epitaxy cost can be avoided. In addition, since the first well region 105 is disposed under the bottom of the trench 104, the first well region 105 does not occupy extra space (such as a lateral space of the epitaxial layer 102). Therefore, a cell pitch can be reduced, and a resistance of a channel region is thereby reduced. In the embodiment, the first well region 105 of the second conductivity type is used as a reduced surface field (RESURF) region, so the breakdown voltage of the subsequently formed semiconductor device 100 is increased. In other words, the first well region 105 can improve the withstand voltage of the semiconductor device 100.

According to some embodiments, as shown in FIG. 1E, an insulating layer 106 is formed in the trench 104 and on the first well region 105 by an oxidation process, and a drive in process is performed on the insulating layer 106 to increase the density of the insulating layer 106. In some embodiments, the insulating layer 106 covers the portion of the epitaxial layer 102 exposed by the trench 104. In some embodiments, the insulating layer 106 may be silicon oxide, germanium oxide, another suitable semiconductor oxide material or a combination thereof. In some embodiments, the oxidation process may be thermal oxidation, radical oxidation or another suitable process. In some embodiments, the drive in process may be a rapid thermal annealing (RTA) process.

According to some embodiments, as shown in FIG. 1F, performing an etching process to remove the bottom portion of the insulating layer 106, and the first well region 105 is thereby exposed. In some embodiments, after the etching process, the sidewall portion of the insulating layer 106 is kept. In some embodiments, the etching process may be a dry etch process, a wet etch process, a plasma etching process, a reactive ion etching process, another suitable process, or a combination thereof.

Then, according to some embodiments, performing an ion implantation process to the trench 104 to form a heavily doped region 107 by using the patterned mask 103 and the remaining insulating layer 106 as a protective mask. In the embodiment, the heavily doped region 107 is in the upper portion of the first well region 105. In the embodiment, the heavily doped region 107 and the first well region 105 have the same conductivity type, such as the second conductivity type). In other words, in the embodiment, the heavily doped region 107 is p-type. In some embodiments, the dopant of the heavily doped region 107 can be $BF_2$. In some embodiments, the doping concentration of the heavily doped region 107 is greater than that of the first well region 105. In some embodiments, the doping concentration of the heavily doped region 107 is in a range from about 1E19 atoms/cm$^3$ to about 1E21 atoms/cm$^3$. In the embodiment, the heavily doped region 107 of the second conductivity type is also used as a RESURF region to further reduce the surface electric field.

According to some embodiments, as shown in FIG. 1G, a first gate electrode material is formed in the trench 104 by a deposition process, lithography patterning process and etching process. Then, performing an ion implantation process and a drive in process to the first gate electrode material to form a first gate electrode 108 by using the patterned mask 103 and the remaining insulating layer 106 as a protective mask. In the embodiment, the first gate electrode 108 fills the lower portion of the trench 104, but the first gate electrode 108 does not completely fill the trench 104. In addition, the first gate electrode 108 is surrounded by the insulating layer 106. In the embodiment, the insulating layer 106 is disposed between the first gate electrode 108 and the epitaxial layer 102. In the embodiment, the first gate electrode 108 is vertically overlapped with the first well region 105.

In some embodiments, the first gate electrode 108 may be a single layer or multiple layers, and the first gate electrode 108 may be formed of amorphous silicon, polysilicon or a combination thereof. In some embodiments, the deposition process may be physical vapor deposition (PVD), chemical vapor deposition (CVD), another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be a dry etch process, a wet etch process, a plasma etching process, a reactive ion etching process, another suitable process, or a combination thereof.

In the embodiment, the first gate electrode 108 and the first well region 105 have the same conductivity type, such as the second conductivity type. In other words, the first gate electrode 108 is p-type. In some embodiments, the dopant of the first gate electrode 108 can be $BF_2$. In some embodiments, the doping concentration of the first gate electrode 108 is greater than that of the first well region 105. In some embodiments, the doping concentration of the first gate electrode 108 is in a range from about 1E19 atoms/cm$^3$ to about 1E21 atoms/cm$^3$. In the embodiment, the first gate electrode 108 of the second conductivity type is also used as a RESURF region to further reduce the surface electric field.

In the embodiment, the first gate electrode 108, the heavily doped region 107 and the first well region 105 of the second conductivity type can be provided collectively as the RESURF region to extend the length of the depletion region of the P-N junction. The largest electric field below the electrode is reduced, and the breakdown voltage of the subsequently formed semiconductor device 100 is thereby increased. In other words, the first gate electrode 108, the heavily doped region 107 and the first well region 105 can improve the withstand voltage of the semiconductor device 100. In addition, compared to the RESEURF region simply formed by the ion implantation process, in the embodiment, the first gate electrode 108, the heavily doped region 107 and the first well region 105 can significantly increase the depth of the RESURF region, and the withstand voltage of the semiconductor device 100 is further improved.

Then, according to some embodiments, as shown in FIG. 1H, the upper portion of the insulating layer 106 is removed by the etching process. In some embodiments, after the etching process, the top surface of the insulating layer 106 is higher than the top surface of the first gate electrode 108. In some other embodiments, after the etching process, the top surface of the insulating layer 106 is lower than the top surface of the first gate electrode 108. In some other embodiments, after the etching process, the top surface of the insulating layer 106 is co-planar with the top surface of the first gate electrode 108. In some embodiments, the etching process may be a dry etch process, a wet etch process, a plasma etching process, a reactive ion etching process, another suitable process, or a combination thereof.

According to some embodiments, as shown in FIG. 1I, a mask layer 109 is formed on the first gate electrode 108 in the trench 104. In the embodiment, the mask layer 109 covers the insulating layer 106 and the first gate electrode 108. In some embodiments, the material of the mask layer 109 is the same as that of the patterned mask 103. In some other embodiments, the material of the mask layer 109 is different from that of the patterned mask 103. In some embodiments, the mask layer 109 is formed by forming mask material using a deposition process or a coating process, and then performing an etch back process.

Then, according to some embodiments, as shown in FIG. 1J, after forming the mask layer 109, the patterned mask 103 is removed. During the removal of the patterned mask 103, the mask layer 109 covers the first gate electrode 108. Therefore, the mask layer 109 can prevent the removing process of the patterned mask 103 from damaging the first gate electrode 108.

Then, according to some embodiments, as shown in FIG. 1K, after removing the patterned mask 103, the mask layer 109 is removed to expose the first gate electrode 108 and the insulating layer 106. According to some embodiments, after removing the mask layer 109, a cleaning process is selectively performed.

According to some embodiments, as shown in FIG. 1L, an insulating layer 110 is formed on the epitaxial layer 102, the insulating layer 106 and the first gate electrode 108 by a deposition process. In some embodiments, the insulating layer 110 extends from the top surface of the epitaxial layer 102 into the trench 104, and the insulating layer 110 covers the sidewalls of the epitaxial layer 102 and the top surfaces of the insulating layer 106 and the first gate electrode 108. In the embodiment, the insulating layer 110 does not completely fill the trench 104. In other words, after forming the insulating layer 110, there is a space on the insulating layer 110 in the trench 104. In some embodiments, the insulating layer 110 may be silicon oxide, hafnium oxide, zirconium oxide, aluminum oxide, aluminum hafnium dioxide, silicon hafnium dioxide, silicon hafnium oxynitride, tantalum hafnium oxide, titanium hafnium oxide, zirconium hafnium oxide, another suitable high-k dielectric material or a combination thereof. In some embodiments, the material of the insulating layer 110 is different from that of the insulating layer 106. In some other embodiments, the material of the insulating layer 110 is the same as that of the insulating layer 106. In the embodiment, the deposition process is a conformal deposition process and may be PVD, CVD, another suitable process or a combination thereof.

Then, according to some embodiments, a second gate electrode 111 is formed on the insulating layer 110 in the trench 104 by a deposition process, lithography patterning process and etching process. In some embodiments, the second gate electrode 111 fills the space above the insulating material 110 in the trench 104. In the embodiment, the second gate electrode 111 is on the first gate electrode 108, and the second gate electrode 111 is separated from the first gate electrode 108 by the insulating material 110. In the embodiment, the second gate electrode 111 is vertically overlapped with the first well region 105. In some embodiments, as shown in FIG. 1L, the lateral length of the second gate electrode 111 is greater than that of the first gate electrode 108.

In some embodiments, the second gate electrode 111 may be a single layer or multiple layers, and the second gate electrode 111 may be formed of amorphous silicon, polysilicon, one or more metals, metal nitride, metal silicide, conductive metal oxide or a combination thereof. Specifically, the above-mentioned metal may comprise Mo, W, Ti, Ta, Pt or Hf, but it is not limited thereto. The above-mentioned metal nitride may comprise MoN, WN, TiN and TaN, but it is not limited thereto. The above-mentioned metal silicide may comprise $WSi_x$. The above-mentioned conductive metal oxide may comprise $RuO_2$ and indium tin oxide (ITO), but it is not limited thereto. In some embodiments, the deposition process may be PVD, CVD, another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be a dry etch process, a wet etch process, a plasma etching process, a reactive ion etching process, another suitable process, or a combination thereof.

In the embodiment, since the first gate electrode 108 is disposed under the second gate electrode 111, the gate-drain capacitance (Cgd) at the bottom of the trench of the traditional super junction trench metal oxide semiconductor field-effect transistor (MOSFET) can be eliminated, and the gate-drain charge (Qgd) is effectively reduced.

In addition, in the embodiment, since the first well region 105 is disposed under the bottom of the trench 104, the first gate electrode 108 and the second gate electrode 111, the junction field effect transistor (JFET) effect of the traditional super junction trench MOSFET can be avoided, and the on-resistance (Ron) is thereby effectively reduced.

According to some embodiments, as shown in FIG. 1M, a second well region 112 is formed in the epitaxial layer 102 by performing an ion implantation process. Then, a second heavily doped region 113 is formed on the second well region 112 by performing another ion implantation process. In some embodiments, the second well region 112 acts as the channel region of the semiconductor device 100, and the second heavily doped region 113 acts as the source (S) of the semiconductor device 100. In the embodiment, the second gate electrode 111 is surrounded by the second well region 112 and the second heavily doped region 113. In the embodiment, the second well region 112 is separated from the first well region 105. In some embodiments, the bottom surface of the second well region 112 is higher than the top surface of the first gate electrode 108. In other words, an interface between the second well region 112 and the epitaxial layer 102 is higher than the top surface of the first gate electrode 108.

In the embodiment, the second well region 112 and the first well region 105 have the same conductivity type, such as the second conductivity type. In other words, the second well region 112 is p-type. In the embodiment, the second heavily doped region 113 and the epitaxial layer 102 have the same conductivity type, such as the first conductivity type. In other words, the second heavily doped region 113 is n-type. In some embodiments, the doping concentration of the second heavily doped region 113 is greater than that of the epitaxial layer 102. In some embodiments, the doping concentration of the second well region 112 is in a range from about 1E16 atoms/cm$^3$ to about 1E18 atoms/cm$^3$. In some embodiments, the doping concentration of the second heavily doped region 113 is in a range from about 1E18 atoms/cm$^3$ to about 1E21 atoms/cm$^3$.

In the embodiment, since the second well region 112 is separated from the first well region 105, the leakage of the first well region 105 due to the high electric field impact ionization can be avoided, and the avalanche current can be drained by being directly driven into the second heavily doped region 113 (the source). Therefore, the problem of the gate oxide charging/gate oxide injection of the surrounding insulating layer 110 caused by the avalanche current going from the first well region 105 into the second well region 112 can be avoided, and the reliability of the gate oxide is thereby improved. In addition, since the second well region 112 is separated from the first well region 105, the leakage can be avoided, and the activation of the parasitic bipolar junction transistor (BJT) due to the leakage can be avoided. Therefore, the unclamped inductive load (UIL)/ruggedness issue is thereby avoided.

Then, according to some embodiments, as shown in FIG. 1N, a dielectric layer 114 is formed on the second gate electrode 111 by a deposition process, lithography patterning process and etching process. In the embodiment, the dielectric layer 114 covers the second gate electrode 111 and the insulating material 110, and the dielectric layer 114 has an opening 114a exposing the second well region 112 and the second heavily doped region 113.

In some embodiments, the dielectric layer 114 may be silicon oxide, hafnium oxide, zirconium oxide, aluminum oxide, aluminum hafnium dioxide, silicon hafnium dioxide, silicon hafnium oxynitride, tantalum hafnium oxide, titanium hafnium oxide, zirconium hafnium oxide, another suitable high-k dielectric material or a combination thereof. In some embodiments, the material of the dielectric layer 114 is different from that of the insulating layer 110. In some other embodiments, the material of the dielectric layer 114 is the same as that of the insulating layer 110. In some embodiments, the deposition process may be PVD, CVD, another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be a dry etch process, a wet etch process, a plasma etching process, a reactive ion etching process, another suitable process, or a combination thereof.

According to some embodiments, as shown in FIG. 1O, a contact 115 is formed in the opening 114a of the dielectric layer 114 by a deposition process, lithography patterning process and etching process. In some embodiments, the contact 115 extends through the dielectric layer 114 and the second heavily doped region 113, and the contact 115 extends into the second well region 112 to electrically connect the second well region 112 and the second heavily doped region 113. In some embodiments, the contact 115 may include Cu, Ag, Au, Al, W, a combination thereof or another suitable conductive material. In some embodiments, the deposition process may be PVD, CVD, another suitable process or a combination thereof. In some embodiments, the lithography patterning process include photoresist coating (for example, spin-coating), soft baking, mask aligning, exposing, post-exposure baking, photoresist developing, washing and drying (for example, hard baking), another suitable process, or a combination thereof. In some embodiments, the etching process may be a dry etch process, a wet etch process, a plasma etching process, a reactive ion etching process, another suitable process, or a combination thereof.

According to some embodiments, as shown in FIG. 1O, before forming the contact 115, an ion implantation process may be performed to form a contact doping region 116 in the second well region 112. In some embodiments, the contact doping region 116 is below the contact 115, and the contact doping region 116 and the second well region 115 have the same conductivity type, such as the second conductivity type. In other words, in the embodiment, the contact doping region 116 is p-type. In some embodiments, the doping concentration of the contact doping region 116 is in a range from about 1E19 atoms/cm$^3$ to about 1E21 atoms/cm$^3$.

In some embodiments, a barrier layer (not shown) is formed between the contact 115 and the dielectric layer 114 by a deposition process, lithography patterning process and etching process. In some embodiments, the barrier layer may include TiN, Al$_2$O$_3$, MgO, AlN, Ta$_2$O$_5$, SiO$_2$, HfO$_2$, ZrO$_2$, MgF$_2$, CaF$_2$ or a combination thereof.

According to some embodiments, as shown in FIG. 1O, after forming the contact 115, a metal layer 117 may be formed on the contact 115 by a deposition process. In some embodiments, the metal layer 117 covers the dielectric layer 114 and the contact 115, and the metal layer 117 is electrically connected to the contact 115. In some embodiments, the metal layer 117 may include Cu, Ag, Au, Al, W, a combination thereof or another suitable conductive material. In some embodiments, the material of the metal layer 117 is the same as that of the contact 115. In some other embodiments, the material of the metal layer 117 is different from that of the contact 115. In some embodiments, the deposition process may be PVD, CVD, another suitable process or a combination thereof. In some embodiments, after forming the metal layer 117, the process for forming the semiconductor device 100 is complete.

According to some embodiments of the invention, since the first well region is disposed under the bottom of the trench by the ion implantation process and the drive in process, requirements for multiple process cycles comprising epitaxy, p-type dopant implantation and high-temperature diffusion can be omitted. Therefore, the process of forming the first well region is simple, and the expensive epitaxy cost can be avoided. In addition, since the first well region is disposed under the bottom of the trench, the first well region does not occupy extra space (such as a lateral space of the epitaxial layer). Therefore, a cell pitch can be reduced, and a resistance of a channel region is thereby reduced.

In addition, the first gate electrode, the heavily doped region and the first well region can be provided collectively as the RESURF region, so the breakdown voltage of the semiconductor device is increased. In other words, the withstand voltage of the semiconductor device is improved. In addition, compared to the RESEURF region simply formed by the ion implantation process, in the embodiment, the first gate electrode, the heavily doped region and the first well region can significantly increase the depth of the RESURF region, and the withstand voltage of the semiconductor device is further improved.

In addition, since the second well region is separated from the first well region, the leakage of the first well region due to the high electric field impact ionization can be avoided, and the avalanche current can be drained by being directly driven into the second heavily doped region (the source). Therefore, the problem of the gate oxide charging/gate oxide injection of the surrounding insulating layer caused by the avalanche current going from the first well region into the second well region can be avoided, and the reliability of the gate oxide is thereby improved. In addition, since the second well region is separated from the first well region, the leakage can be avoided, and the activation of the parasitic bipolar junction transistor (BJT) due to the leakage can be avoided. Therefore, the unclamped inductive load (UIL)/ruggedness issue is thereby avoided.

While the disclosure has been described by way of example and in terms of the embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate having a first conductivity type;
    an epitaxial layer having the first conductivity type disposed on the substrate, and a trench is in the epitaxial layer;
    a first well region disposed in the epitaxial layer under the trench, and the first well region has a second conductivity type that is different from the first conductivity type;
    a first gate electrode disposed in the trench and having the second conductivity type, wherein a doping concentration of the first gate electrode is greater than a doping concentration of the first well region; and
    a second gate electrode disposed in the trench on the first gate electrode, wherein the second gate electrode is separated from the first gate electrode by a first insulating layer.

2. The semiconductor device of claim 1, wherein the first gate electrode and the second gate electrode are vertically overlapped with the first well region.

3. The semiconductor device of claim 1, further comprising:
    a heavily doped region disposed in a upper portion of the first well region and having the second conductivity type.

4. The semiconductor device of claim 3, wherein a doping concentration of the first heavily doped region is greater than a doping concentration of the first well region.

5. The semiconductor device of claim 1, further comprising:
    a second insulating layer disposed between the first gate electrode and the epitaxial layer.

6. The semiconductor device of claim 1, further comprising:
    a second well region surrounding the second gate electrode and having the second conductivity type.

7. The semiconductor device of claim 6, wherein the second well region is separated from the first well region.

8. The semiconductor device of claim 6, further comprising:
    a second heavily doped region surrounding the second gate electrode and on the second well region, and the second heavily doped region has the second conductivity type.

9. The semiconductor device of claim 8, further comprising:
    a dielectric layer disposed on the second gate electrode; and
    a contact extending through the dielectric layer and electrically connected to the second well region and the second heavily doped region.

10. The semiconductor device of claim 9, further comprising:
    a contact doping region disposed in the second well region and under the contact, and the contact doping region has the second conductivity type.

11. The semiconductor device of claim 9, further comprising:
    a metal layer disposed on the contact and the dielectric layer; and
    a barrier layer disposed between the contact and the dielectric layer.

12. A method for forming the semiconductor device of claim 1, comprising:
    providing a substrate having a first conductivity type;
    forming an epitaxial layer having the first conductivity type on the substrate;
    forming a trench in the epitaxial layer;
    forming a first well region in the epitaxial layer under the trench, wherein the first well region has a second conductivity type that is different from the first conductivity type;
    forming a first gate electrode having the second conductivity type; and
    forming a second gate electrode in the trench on the first gate electrode, wherein the second gate electrode is separated from the first gate electrode by a first insulating layer.

13. The method of claim 12, wherein forming the trench comprises:
   forming a patterned mask having a first opening on the epitaxial layer; and
   performing an etching process on the epitaxial layer through the first opening.

14. The method of claim 13, wherein forming the first well region comprises:
   performing an ion implantation process and a drive in process on the trench by using the patterned mask as a protective film.

15. The method of claim 13, further comprising:
   forming a mask layer on the first gate electrode in the trench after forming the first gate electrode and before forming the second gate electrode;
   removing the patterned mask; and
   removing the mask layer.

16. The method of claim 12, further comprising:
   performing an ion implantation process after forming the first well region and before forming the first gate electrode to form a first heavily doped region having the second conductivity type in an upper portion of the first well region.

17. The method of claim 12, further comprising:
   forming a second well region having the second conductivity type surrounding the second gate electrode; and
   forming a second heavily doped region having the first conductivity type on the second well region, and the second heavily doped region surrounds the second gate electrode.

18. The method of claim 17, further comprising:
   forming a dielectric layer on the second gate electrode; and
   forming a contact through the dielectric layer, and the contact is electrically connected to the second well region and the second heavily doped region.

19. The method of claim 18, further comprising:
   forming a contact doping region in the second well region and under the contact, and the contact doping region has the second conductivity type.

* * * * *